(12) United States Patent
Finteis

(10) Patent No.: US 7,020,806 B2
(45) Date of Patent: Mar. 28, 2006

(54) METHOD FOR TESTING MEMORY UNITS TO BE TESTED AND TEST DEVICE

(75) Inventor: Thomas Finteis, Munich (DE)

(73) Assignee: Infineon Technologies AG, Munich (DE)

( * ) Notice: Subject to any disclaimer, the term of this patent is extended or adjusted under 35 U.S.C. 154(b) by 564 days.

(21) Appl. No.: 10/225,592

(22) Filed: Aug. 22, 2002

(65) Prior Publication Data

US 2003/0039156 A1    Feb. 27, 2003

(30) Foreign Application Priority Data

Aug. 22, 2001   (DE)  ................. 101 41 026

(51) Int. Cl.
*G06F 11/00* (2006.01)
(52) U.S. Cl. .............. 714/42; 714/54; 714/30; 714/718; 714/719
(58) Field of Classification Search .............. 714/30, 714/42, 54, 718, 719
See application file for complete search history.

(56) References Cited

U.S. PATENT DOCUMENTS

| | | | | |
|---|---|---|---|---|
| 5,793,686 A | * | 8/1998 | Furutani et al. | ............ 365/201 |
| 5,923,600 A | * | 7/1999 | Momohara | ................ 365/201 |
| 6,003,149 A | * | 12/1999 | Nevill et al. | ................ 714/718 |
| 6,058,056 A | * | 5/2000 | Beffa et al. | ................ 365/201 |
| 6,119,249 A | * | 9/2000 | Landry | .............. 714/718 |
| 6,163,491 A | | 12/2000 | Iwamoto et al. | |
| 6,212,113 B1 | | 4/2001 | Maeda | |
| 6,275,444 B1 | | 8/2001 | Nakano et al. | |
| 6,317,372 B1 | * | 11/2001 | Hayashi et al. | ............ 365/201 |
| 6,320,804 B1 | * | 11/2001 | Dahn | ................ 365/201 |
| 6,636,455 B1 | * | 10/2003 | Maruyama et al. | ......... 365/233 |
| 6,636,998 B1 | * | 10/2003 | Lee et al. | ................ 714/735 |
| 6,732,304 B1 | * | 5/2004 | Ong | ................ 714/718 |

FOREIGN PATENT DOCUMENTS

| | | |
|---|---|---|
| JP | 2000040398 A | 2/2000 |
| JP | 2000182399 A | 6/2000 |

* cited by examiner

*Primary Examiner*—Robert Beausoliel
*Assistant Examiner*—Emerson Puente
(74) *Attorney, Agent, or Firm*—Jenkins, Wilson & Taylor, P.A.

(57) ABSTRACT

The invention provides a method for testing a memory unit (113) to be tested in a test device (100), the memory unit (113) to be tested being introduced into the test device (100), a first data register (102a–102N) to be tested being read out from the memory unit (113) to be tested and being tested in a comparator unit (106), and then at least one further data register (102a–102N) to be tested being read out of the memory unit (113) to be tested and tested in a comparator unit (106).

6 Claims, 2 Drawing Sheets

METHOD FOR TESTING MEMORY UNITS TO BE TESTED AND TEST DEVICE

TECHNICAL FIELD

The present invention relates generally to a method and a device for testing circuit units to be tested, and relates in particular to a method and to a test device for testing memory units to be tested, it being possible to carry out a test at a reduced data rate.

BACKGROUND ART

Microelectronic circuits must be tested for faults after their fabrication. This relates in particular to memory units such as, for example, SDRAMs which require a comprehensive test to be carried out in a test device in order to prevent malfunctions as far as possible after their fabrication.

When a memory unit to be tested is tested, "actual data" is read out of the memory unit to be tested and then compared with "setpoint data" in a comparator unit of the test device. The costs of a comparator unit increase here if data rates increase because an increase in the data rate makes it necessary to reduce a chronological inaccuracy of the comparator unit.

Automatic test devices, which are also referred to as testers, make it possible, for example, to measure values to be registered such as a maximum frequency at which a memory unit functions without faults.

It is expedient that test devices operate automatically, memory units to be tested being tested with a minimum frequency and minimum accuracy, but on the other hand the largest possible number of circuit components (chips) which contain memory units are tested simultaneously.

The present generations of integrated electronic components such as, for example, memory units disadvantageously require test devices which are very costly owing to the high minimum frequency which must be made available in a test.

On the other hand, there are essentially two groups of malfunctions which are to be registered by testing memory units to be tested:
  (i) an information item has not been correctly written into the memory cell array of a memory unit to be tested or not correctly read out from the memory cell array of the memory unit to be tested; and
  (ii) an output unit of the memory unit to be tested is faulty.

The output unit which is designated above under item (ii) or its efficiency can only be tested at specified high clock and data frequencies, while the memory cell array of the memory unit to be tested can also be tested reliably at relatively low clock and data frequencies and at relatively low speeds.

Thus, for example in currently customary methods which operate in the DDR (Double Data Rate) mode, data registers are read out of the memory unit to be tested and written into the memory unit to be tested, a data rate being used which is doubled by the fact that data is transferred not only at a rising clock edge but also at a falling clock edge.

This double data rate is generated component-internally by virtue of the fact that at least two bits from the memory cell array of the memory unit to be tested are read out simultaneously per data connection and buffered upstream of the output unit (referred to as a prefetch), and said bits are then output successively, the data rate at this specific output unit corresponding to at least twice the clock frequency, while the memory cell array is operated with a single (low or original) clock frequency. It is to be noted that a corresponding procedure is executed when the memory cell array is written to.

The same applies to future-generation memory units to be tested or standard versions with a relatively high number of buffer units (relatively high number of prefetch units).

A disadvantage of conventional methods for testing memory units to be tested is thus that although conventional test devices can make available a required clock frequency for the memory unit to be tested, a chronological inaccuracy of a comparator unit is however so high that the increased data rate obtained cannot be coped with.

It is thus inexpedient that there is a need for a costly test device with a comparator unit whose chronological inaccuracy is small enough to test the memory unit at an increased data rate.

It is a disadvantage that in general it is not possible to use test devices which are available in a cost-effective manner and which are operated with a simple, low clock frequency.

SUMMARY OF THE INVENTION

An object of the present invention is therefore to provide a method for testing a memory unit to be tested, and a test device, in which it is possible to test a memory cell array of a memory unit to be tested with critical time parameters in a test device whose comparator units can process a low, single clock frequency alone, the data registers which are buffered in a component-internal buffer unit being tested successively.

This object is achieved according to the invention by means of the method specified in patent claim 1, and by means of a test device having the features of patent claim 5.

Further refinements of the invention emerge from the subclaims.

An essential idea of the invention is that buffered data registers are tested in buffer units using a single clock frequency so that a cost-effective test device (or a cost-effective comparator unit in the test device) can be used, while output units of the memory unit to be tested can be tested later using more costly test devices.

According to the invention a read out operation is repeated via the output unit M times with appropriately changed addresses because only 1/M data is read out via the output unit per readout instruction, M corresponding to a number of buffer units for buffering data registers.

The method according to the invention for testing memory units to be tested in a test device has essentially the following steps:

a) the memory unit to be tested is introduced into the test device in which a test is carried out using comparator units which operate with a single, i.e. low data rate, and are thus advantageously cost-effective;

b) a first data register to be tested is read out of the memory cell array to be tested of the memory unit to be tested, and the first data register to be tested is buffered in at least one buffer unit, the number of data registers which are to be tested and which are read out of a memory cell array to be tested of the memory unit to be tested corresponding to the prefetch or to the number of buffer units;

c) the first buffered data register is tested in a comparator unit of the test device, a test of the data registers to be tested advantageously allowing conclusions to be drawn with respect to faults in the memory unit to be tested;

d) at least one further data register to be tested is read out of the memory cell array to be tested, and the further data register to be tested is buffered in at least one further buffer unit; and e) the second buffered data register is tested in a comparator unit of the test device, a test of the data registers to be tested advantageously allowing conclusions to be drawn with respect to faults in the memory unit to be tested.

Advantageous developments and improvements of the respective subject matter of the invention can be found in the subclaims.

According to one preferred development of the present invention, a number of data registers N to be tested corresponds to a number of buffer units M, i.e. the following relationship applies:

N=M.

According to one further preferred development of the present invention, a clock signal for clocking the memory unit to be tested is made available by a clock-generating unit of the test device.

According to yet another preferred development of the present invention, the comparator unit reads out the buffer units sequentially in order to carry out sequential testing of the data to be tested at a data rate which is reduced by the factor 1/M (M=number of buffer units).

According to yet another preferred development of the present invention, the data registers to be tested are buffered in buffer units, as a result of which the data registers to be tested can be read out sequentially as buffered data registers and processed further.

According to yet another preferred development of the present invention, an output unit of the memory unit to be tested is switched into an operating mode in such a way that a buffered data register is present at the comparator unit during at least one entire clock period of a clock signal which is output by a clock-generating unit.

According to yet another preferred development of the present invention, two bits are read out from at least one memory cell array of the memory unit to be tested per clock of the clock signal generated by the clock signal-generating unit.

According to yet another preferred development of the present invention, a chronological inaccuracy of the comparator unit does not affect the test result.

The test device according to the invention for testing a memory unit to be tested also has:

a comparator unit for testing the buffered data registers in order to make available tested data registers, the comparator unit carrying out testing with a rate which is reduced by a factor of 1/M, which does not have a disadvantageous effect on the test result and advantageously provides complete test coverage; and a clock signal-generating unit for making available a clock signal.

Exemplary embodiments of the invention are illustrated in the drawings and explained in more detail in the following description.

DETAILED DESCRIPTION OF THE INVENTION

Figure 1:
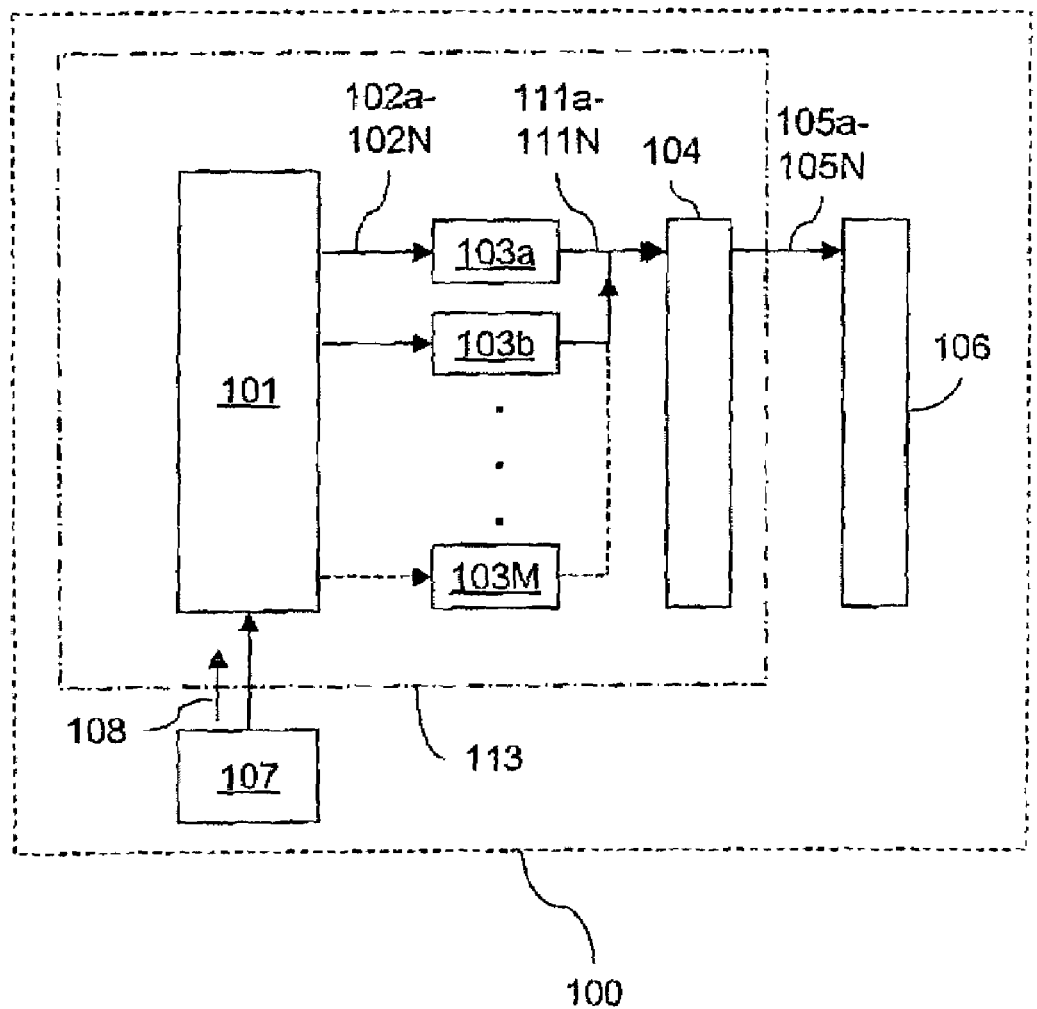
FIG. 1 shows a test device for testing a memory unit to be tested with buffer units, and a comparator unit operating at a low data rate in accordance with a preferred exemplary embodiment of the present invention.

FIG. 1 shows a test device 100 according to an exemplary embodiment of the present invention. A memory unit 113 to be tested is introduced into the test device 100 and a clock signal 108 which is generated by a clock-generating unit 107 is applied to it.

In order to test the memory unit 113 to be tested, according to the exemplary embodiment of the invention data registers 102a–102N which are to be tested are read out of the memory cell array 101 to be tested of the memory unit 113 to be tested.

It is particularly advantageous here that the data registers 102a–102N to be tested can be tested in a cost-effective comparator unit 106 which only has to process a reduced data rate.

When the read instruction occurs, only 1/M data is read out in comparison with normal operation (increased data rate), M representing the number of buffer units 103a–103M made available. The read instruction or read operation is repeated here M times with appropriately changed addresses.

A data rate and other test conditions for the at least one memory cell array 101 of the memory unit 113 to be tested is [sic] not changed as a result of this so that a test which is carried out in the test device 100 is not falsified.

Performance of an output unit 104 of the memory unit 113 to be tested is not checked, i.e. the performance of the respective output unit 104 must subsequently be checked with a high speed test device.

However, a test time for the at least one memory cell array 101 of the memory unit 113 to be tested can advantageously be moved, for test coverage, to a generally essentially more cost-effective test device 100 (or the essentially more cost-effective comparator units 106 of a test device 100).

The data registers (102a–102N) to be tested can be buffered in buffer units (103a–103M), as a result of which the data registers (102a–102N) to be tested can be read out sequentially as buffered data registers (111a–111N) and processed further.

The buffered data registers 111a–111N are output as buffered data registers 105a–105N to be tested, via the output unit 104 of the memory unit 113 to be tested, and are made available for a test in the comparator unit 106 of the test device 100.

Figure 2:
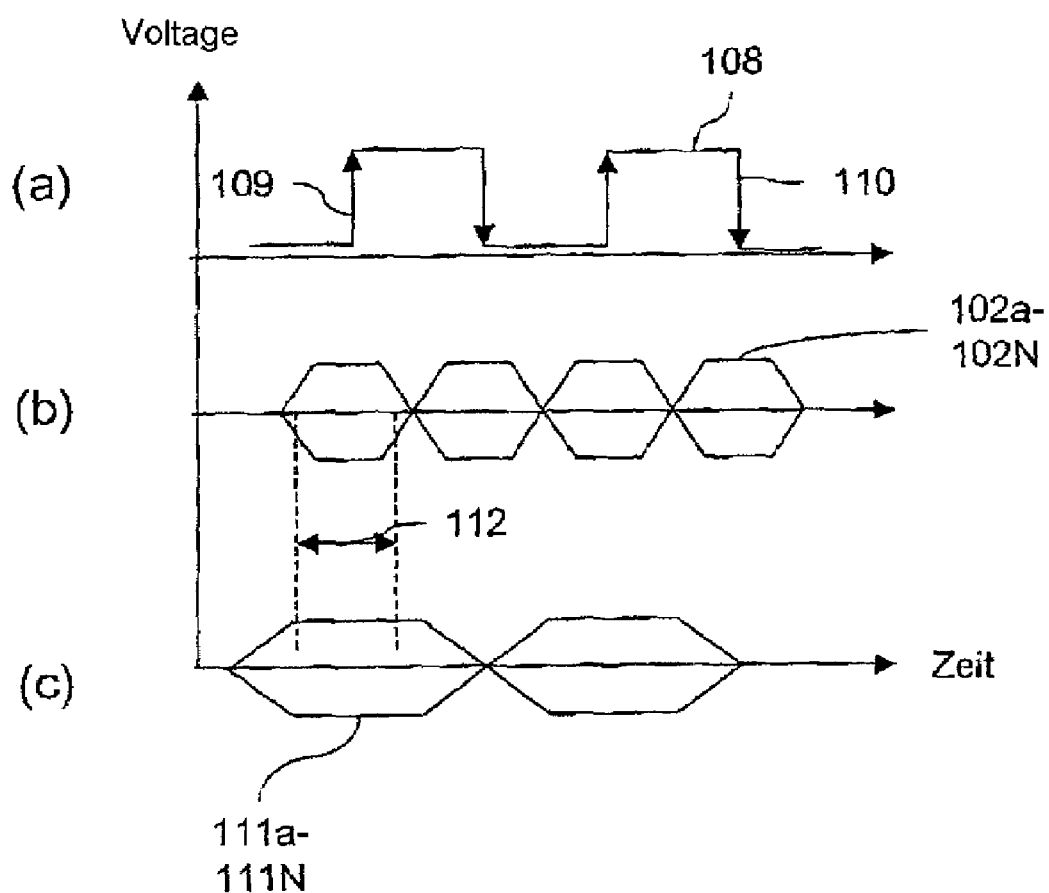
FIG. 2(a) shows a clock signal with rising clock edges and falling clock edges for clocking the memory unit to be tested, and as reference signal for the test sequence.
FIG. 2(b) shows a data stream which is read out in a normal operating mode.
FIG. 2(c) shows a data stream in a test according to the invention, which data stream can be tested using a comparator unit which operates at a low data rate.

Signal profiles or data are or is represented in FIGS. 2(a), 2(b) and 2(c) in order to illustrate an exemplary embodiment according to the present invention.

FIG. 2(a) shows a clock signal 108 which has been written to by the clock signal-generating unit 107 explained with reference to FIG. 1.

The clock signal 108 has rising clock edges 109 and falling clock edges 110. If data is read out in the normal operating mode, i.e. data registers to be tested are read out of the circuit unit 113 to be tested, a data item is read out in each case for one rising clock edge 109 and one falling clock edge 110, as illustrated in FIG. 2(b).

A chronological inaccuracy 112 (represented in FIG. 2(b)) of the comparator unit 106 now results in a situation in which when data is read out in the normal operating mode according to FIG. 2(b), data cannot be tested with sufficient accuracy.

It is to be noted that the represented chronological inaccuracy 112 of the comparator 106 of the test device contains an overall chronological inaccuracy of measuring devices connected to the output unit 104.

As mentioned, using comparator units 106 or measuring devices with low chronological inaccuracy 112 leads to economic disadvantages as these measuring devices are very expensive.

FIG. 2(c) shows a data stream of a data register which is to be tested and which is read out with a reduced data rate, in this case with a half data rate (M=2).

It is clearly apparent that the data stream shown in FIG. 2(c) can be tested completely using an "inaccurate" comparator unit 106 in contrast to the data stream shown in FIG. 2(b).

It is to be noted that with the method according to the invention for testing a memory unit 113 to be tested in a test device 100 it is possible to test a large number of components in parallel, a reduced data rate being used when testing the buffered data registers 105a–105N to be tested.

The present invention provides a method for testing a memory unit to be tested in a test device, in which method cost-effective comparator units and/or measuring devices can be used.

In particular for the development of new chip generations or component generations in which high data rates are predominant, the invention permits memory cell arrays of memory units to be tested to be tested with a reduced data rate.

The accuracy of test devices can be disadvantageously increased only with high economic expenditure, the costs for a test device being out of all proportion to their accuracy requirements. This becomes clearer the more complex the memory units to be tested.

It is also expedient that existing measuring devices, test devices and peripheral devices as well as already existing comparator devices can be used in memory units to be tested even for the development of future generations of chips, memory modules, memory cell arrays etc., which provides a considerable economic advantage.

Although the present invention has been described above with reference to preferred exemplary embodiments, it is not restricted to them but can instead be modified in a variety of ways.

What is claimed is:

1. A method for testing a memory unit to be tested in a test device, in which method a data rate is reduced, the method comprising:
   a) introducing the memory unit to be tested into the test device;
   b) reading a first data register to be tested from a memory cell array to be tested of the memory unit to be tested;
   c) buffering the first data register to be tested in a first buffer unit;
   d) testing the first data register to be tested in a comparator unit of the test device;
   e) reading, by the comparator unit, the buffer unit via an output unit;
   e) reading at least one further data register to be tested from the memory cell array to be tested of the memory unit to be tested;
   f) buffering the at least one further data register to be tested in a second buffer unit;
   g) testing the at least one further data register to be tested in the comparator unit of the test device wherein the comparator unit reads out the second buffer unit via the output unit;
   h) steps b) to e) are repeated for the remaining data registers to be tested;
   i) reading the data registers to be tested sequentially as buffered data registers via the output unit;
   j) reading a data stream of data registers at a reduced data rate; and
   k) switching the output unit of the memory unit to be tested to an operating mode, wherein a buffered data register is present at the comparator unit during at least one entire clock period of a clock signal which is output by a clock-generating unit.

2. The method for testing a memory unit to be tested in a test device as claimed in claim 1, comprising reading a number of data registers to be tested which corresponds to a number of buffer units.

3. The method for testing a memory unit to be tested in a test device as claimed in claim 1, comprising providing a clock-generating unit of the test device to generate a clock signal for clocking the memory unit to be tested.

4. The method for testing a memory unit to be tested in a test device as claimed in claim 1, wherein a chronological inaccuracy of the comparator unit does not affect the test result.

5. A test device for testing a memory unit to be tested, the test device comprising:
   a) a comparator unit for testing the buffered data registers in order to make available tested data registers, wherein the data registers to be tested are buffered in a buffer unit;
   b) an output unit;
   c) a clock signal-generating unit for making available a clock signal;
   d) wherein the data registers to be tested are operable to be read out sequentially as buffered data registers via the output unit;
   e) wherein the data stream of data registers is operable to be read out at a reduced data rate; and
   f) wherein the output unit of the memory unit to be tested is operable to be switched to an operating mode, and a buffered data register is present at the comparator unit during at least one entire clock period of the clock signal which is output by the clock-generating unit.

6. The device as claimed in claim 5, wherein the output unit is formed from individual connection pins which can be accessed in parallel.

* * * * *